(12) United States Patent
Chaichanavong et al.

(10) Patent No.: US 8,661,325 B2
(45) Date of Patent: Feb. 25, 2014

(54) ITERATIVE DECODER SYSTEMS AND METHODS

(71) Applicant: Marvell World Trade Ltd., St. Michael (BB)

(72) Inventors: Panu Chaichanavong, Mountain View, CA (US); Nedeljko Varnica, San Jose, CA (US); Nitin Nangare, Santa Clara, CA (US); Gregory Burd, San Jose, CA (US); Zining Wu, Los Altos, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/648,790

(22) Filed: Oct. 10, 2012

(65) Prior Publication Data

US 2013/0246879 A1 Sep. 19, 2013

Related U.S. Application Data

(63) Continuation of application No. 12/329,581, filed on Dec. 6, 2008, now Pat. No. 8,307,268.

(60) Provisional application No. 60/992,870, filed on Dec. 6, 2007.

(51) Int. Cl.
*G06F 11/00* (2006.01)

(52) U.S. Cl.
USPC ............................ 714/795; 714/786; 714/746

(58) Field of Classification Search
USPC ........................................ 714/795, 746, 786
See application file for complete search history.

(56) References Cited

U.S. PATENT DOCUMENTS

| | | | |
|---|---|---|---|
| 6,516,136 B1 | 2/2003 | Lee | |
| 6,581,182 B1 | 6/2003 | Lee | |
| 7,035,029 B2 | 4/2006 | Sawada et al. | |
| 7,257,172 B2 | 8/2007 | Okamoto et al. | |
| 7,689,896 B2 * | 3/2010 | Motwani | 714/792 |
| 7,849,388 B2 | 12/2010 | Esumi et al. | |
| 2005/0066261 A1 | 3/2005 | Morita et al. | |
| 2006/0220926 A1 | 10/2006 | Ito et al. | |
| 2007/0226582 A1 | 9/2007 | Tang et al. | |
| 2008/0022189 A1 * | 1/2008 | Vityaev et al. | 714/770 |
| 2008/0069052 A1 * | 3/2008 | Mezer et al. | 370/332 |
| 2009/0063940 A1 * | 3/2009 | Yen et al. | 714/792 |

OTHER PUBLICATIONS

Kavcic et al., "Binary ISI Channels: Gallager Codes, Density Evolution and Code Performance Bounds", IEEE Transactions on Information Theory, (2003).

(Continued)

*Primary Examiner* — Sarai Butler

(57) ABSTRACT

Systems and methods are provided for improved designs and performance for iterative decoder systems. In some embodiments, the iterative decoder may be decoupled from FIR samples through an FIR RAM, thus resulting in a less complex design and shorter processing times. In some embodiments, an intermediate memory may be used when passing information between the SOVA and LDPC of the iterative decoder. In some embodiments, the SOVA-required information may be continuously serialized from information received from the LDPC during each LDPC iteration. In some embodiments, the $1/(1+D^2)$ precoder of the HR RLL encoder may be split into two serial, $1/(1+D)$ precoders. One $1/(1+D)$ precoder may be pulled outside of the HR RLL encoder and used in conjunction with the iterative decoder. A $1/(1+D)$ precoder may be used with the iterative decoder while maintaining the RLL constraints imposed upon the encoded information by the HR RLL encoder.

20 Claims, 12 Drawing Sheets

(56) References Cited

OTHER PUBLICATIONS

Luby et al., "Improved Low-Density Parity-Check Codes Using Irregular Graphs", IEEE Transactions on Information Theory, 47(2):585-598 (2001).

Richardson et al., "Design of capacity-approaching irregular low-density parity-check codes," IEEE Transactions on Information Theory, 47:619-637 (2001).

Richardson et al., "The Capacity of Low-Density Parity-Check Codes Under Message-Passing Decoding", IEEE Transactions on Information Theory, 47: (2001).

\* cited by examiner

ITERATIVE DECODER SYSTEMS AND METHODS

CROSS-REFERENCE TO RELATED APPLICATIONS

This application is a continuation of co-pending U.S. patent application Ser. No. 12/329,581, filed Dec. 6, 2008, which claims the benefit under 35 U.S.C. §119(e) of U.S. Provisional Application No. 60/992,870, filed Dec. 6, 2007, each of which is hereby incorporated by reference herein in its entirety.

BACKGROUND

This application relates generally to iterative encoder/decoder (ENDEC) systems, and more particularly to reduced complexity iterative architecture for various communication channels.

With the current increase in computational power and the necessity for high quality communication and storage systems, there is a continued demand for high-reliability and high-performance error correction codes such, as, for example, iterative codes. Well designed iterative codes are known to approach channel capacities for many communication channels. However, iterative ENDEC systems can be costly to implement, for example, by having large memory requirements or by consuming a significant numbers of cycles of processing time.

SUMMARY

Accordingly, systems and methods are provided that enable simplified architecture for iterative code encoder/decoder (ENDEC) systems.

In some embodiments, the iterative decoder may be coupled to a channel front end detector using a finite impulse response (FIR) samples RAM. This may result in a system that has less hardware complexity and smaller memory requirements. For example, the system may require fewer instances of soft-output Viterbi algorithm (SOVA) decoders or less internal memory within the iterative decoder. Additionally, the decoupling stay result in a system that can process a codeword in a shorter amount of time (i.e., shorter decoder latency).

In some embodiments, the iterative decoder system may utilize an intermediate memory when propagating data between the SOVA decoders and low-density parity check (LDPC) decoder. For example, the LDPC may perform several processing iterations of a codeword before the resulting data may foe passed to the SOVA. Accordingly, the reliability information messages passed from the LDPC to the SOVA may be buffered as it becomes available during the LDPC decoder operations. These reliability information messages are also known as LDPC extrinsic information or SOVA a-priori information.

In some embodiments, rather than having an intermediate, dedicated memory to store the reliability information messages passed from the LDPC to the SOVA, the messages may be serialized "on the fly" and passed to the SOVA on an as needed basis. For example, during each iteration, the LDPC may generate check-to-bit messages (R-messages). The LDPC extrinsic information, the sum of the R-messages, may be calculated as the R-messages are generated and then passed to the SOVA.

In some embodiments, a $1/(1+D)$ precoder may be used between the iterative ENDEC and the channel. During iterative decoding, this precoder may be incorporated into the channel detector (SOVA). The $1/(1+D)$ precoder may improve iterative decoding performance on some channels. However, incorporating a $1/(1+D)$ precoder into the channel data path may destroy a run-length limit (RLL) constraint imposed on the encoded information by a high-rate RLL (HR RLL) encoder. The HR RLL itself may contain an internal, $1/(1+D^2)$ precoder, whose function can be performed by two $1/(1+D)$ precoders placed in serial. Accordingly, in order to create a design with a $1/(1+D)$ precoder that can be used in conjunction with the iterative decoder and with the HR RLL encoder, the $1/(1+D^2)$ precoder of the HR RLL encoder can be split into two $1/(1+D)$ precoders placed in serial. One of these $1/(1+D)$ precoders may then be pulled outside of the HR RLL encoder to function as both the second half of the HR RLL encoder internal precoder and as the precoder used with the iterative decoder.

BRIEF DESCRIPTION OF THE FIGURES

The above and other aspects and advantages of the invention will be apparent upon consideration of the following detailed description, taken in conjunction with the accompanying drawings, in which like reference characters refer to like parts throughout, and in which.

DETAILED DESCRIPTION OF THE DISCLOSURE

This disclosure is directed toward systems and methods for iterative encoded/decoder (ENDEC) systems that lead to reduced hardware complexity, for example, smaller ENDEC area, shorter processing times, smaller memory requirements, etc. In applications or devices where information may be altered by interference signals or other phenomena, error-correction systems, such as iterative decoder systems, can provide a measured way to protect information against such interference. As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively. In what follows, the coding systems are described in connection with an exemplary magnetic storage read channel. It should be understood, however, that similar techniques can be applied to any other communication channel.

Figure 1:
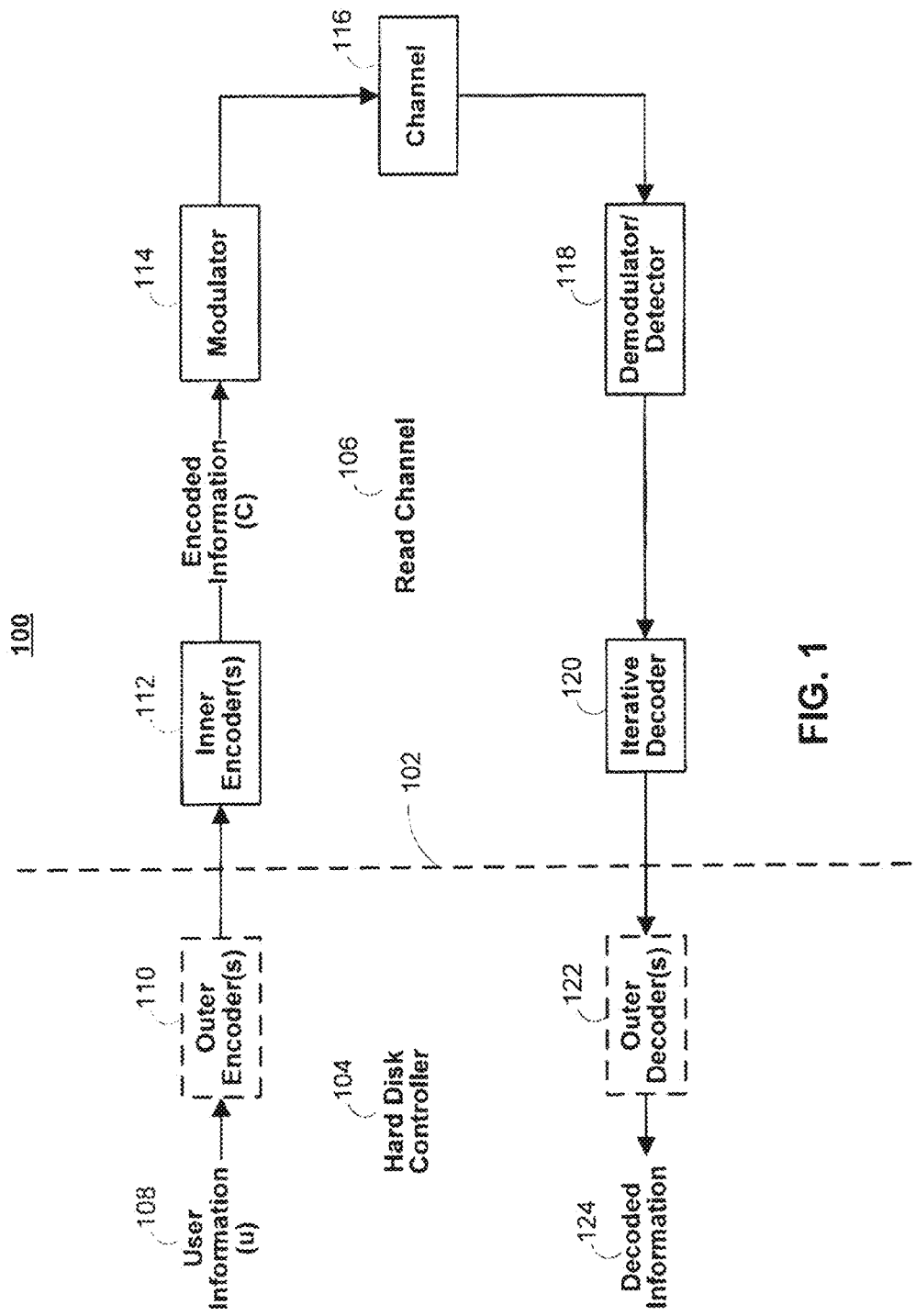
FIGS. 1 and 2 are simplified block diagrams of an iterative decoder error-correcting communications or storage system.

FIG. 1 shows a simplified and illustrative block diagram of digital communications or storage system 100 that can employ the disclosed technology. System 100 may be split by an artificial divider, divider 102, which separates system 100 into hard disk controller 104 and a read channel (RDC) 106. In some embodiments, system 100 may be any suitable communications system that is used to transmit user information 108 from a source to a destination. In other embodiments, system 100 may be a suitable storage system which is used to store and read back user information, from a storage medium. User information 108, sometimes referred to by the variable u, may be any form of information or useful data that a user desires to transmit or store, and can be in any suitable digital form (e.g., coded data, uncoded data, etc.).

Hard disk controller 104 may, for example, allow a central processing unit (CPU) to communicate with a storage system (e.g., a hard drive, flash drive, etc.). RDC 106 may read, write, or otherwise store data, and then pass this data back to the hard disk controller. Hard disk controller 104 may receive user information 108, output decoded information 124, and optionally include outer encode(s) 110 and outer decoder(s) 122, RDCRDC 106 may include inner encoder(s) 112, modulator 114, demodulator 118, and iterative decoder 120.

User information 108 may be transmitted or stored using one or more information-bearing signals. The signals may be transmitted or stored in any suitable transmission or storage medium or media, represented in FIG. 1 by channel 116. For example, channel 116 may be a wired or wireless medium through which the information-bearing signal travels, or an optical (e.g., a cd-rom), magnetic (e.g., a hard disk), or electrical (e.g., FLASH memory or RAM) storage medium that stores the information-bearing signal. Due to random noise that may occur during transmission and storage, as well as the limited transmission or storage capabilities of channel 116, the information-bearing signal may be corrupted or degraded while being transmitted or stored. Thus, the signal received from channel 116 (e.g., by demodulator 118) may be substantially different from the signal that was originally transmitted or stored (e.g., from modulator 114). To reliably transmit or store information in channel 116, an effective transmitter for encoding and transmitting user information 108 may be needed, as well as a corresponding effective receiver for accurately decoding and interpreting user information 108 from a received signal.

In FIG. 1, the transmitter in communications or storage system 100 may include outer encoder 110 (if present), inner encoder(s) 112, and modulator 114. The receiver (described below) may include demodulator 118, iterative decoder 120, and outer decoder(s) 122 (if present). Outer encoder 110 and inner encoder(s) 112 may encode user information 108 into encoded information, sometimes referred to by the variable, c. In particular, outer encoder 110 may first encode user information 108 using a suitable code, which may be a systematic code. For example, outer encoder(s) 110 may encode user information 108 using a Bose-Chaudhuri-Hocquenghem (BCH) Reed-Solomon (RS) code of any suitable correction power. As another example, outer encoder(s) 110 may encode user information 108 using run-length limited (RLL) constraints. Inner encoder(s) 112 may then encode the resulting codeword into encoded information c. For example, inner encoder(s) 112 may be a Low-Density Parity Check (LDPC) encoder using a suitable LDPC code that is selected from among a plurality of available LDPC codes, or a single parity check code (SPC) that are commonly used in read channel chips.

Once inner encoder(s) 112 produces the encoded information c, modulator 114 may convert the encoded information into an information-bearing signal for transmission or storage in channel 116. Modulator 114 may operate using a modulation scheme with a signal constellation set of any suitable size and dimension. For example, modulator 114 may use a quadrature amplitude modulation (QAM) scheme (e.g., 4QAM, 16QAM, 32QAM, etc.), a pulse amplitude modulation (PAM) scheme (e.g., 2PAM, 4PAM, 6PAM, etc.), a phase shift keying (PSK) scheme (e.g., QPSK, 8PSK, etc.), and/or a orthogonal frequency division multiplexing (OFDM) scheme. The type of modulation scheme used by modulator 114 may be selected and implemented based on the properties of channel 116.

Demodulator 118 may receive an altered version of the information-bearing signal transmitted or stored by modulator 114. Demodulator 118 may then convert the information-bearing signal back into a digital sequence using the same modulation scheme as that of modulator 114. Demodulator 118 therefore produces a hard-bit or soft-bit estimate of the encoded information, c, that is decoded by iterative decoder 120 and outer decoder(s) 122 (if present). Iterative decoder 120 and outer decoder(s) 122 may decode the estimated encoded information using the same codes, respectively, as those used by inner encoder(s) 112 and outer encoder(s) 110 to produce decoded information 124. Thus, if the hard-bit or soft-bit estimate produced by demodulater 118 is within the correcting capability of the codes employed by iterative decoder 120 and outer decoder(s) 122, decoded information 124 may be the same as user information 108.

As described above, communications or storage system 100 may or may not include outer encoder(s) 110 and outer decoder(s) 122. For purposes of clarity, and not by way of limitation, the various embodiments disclosed herein will often be described for the scenario in which an outer encoder is used.

Figure 2:
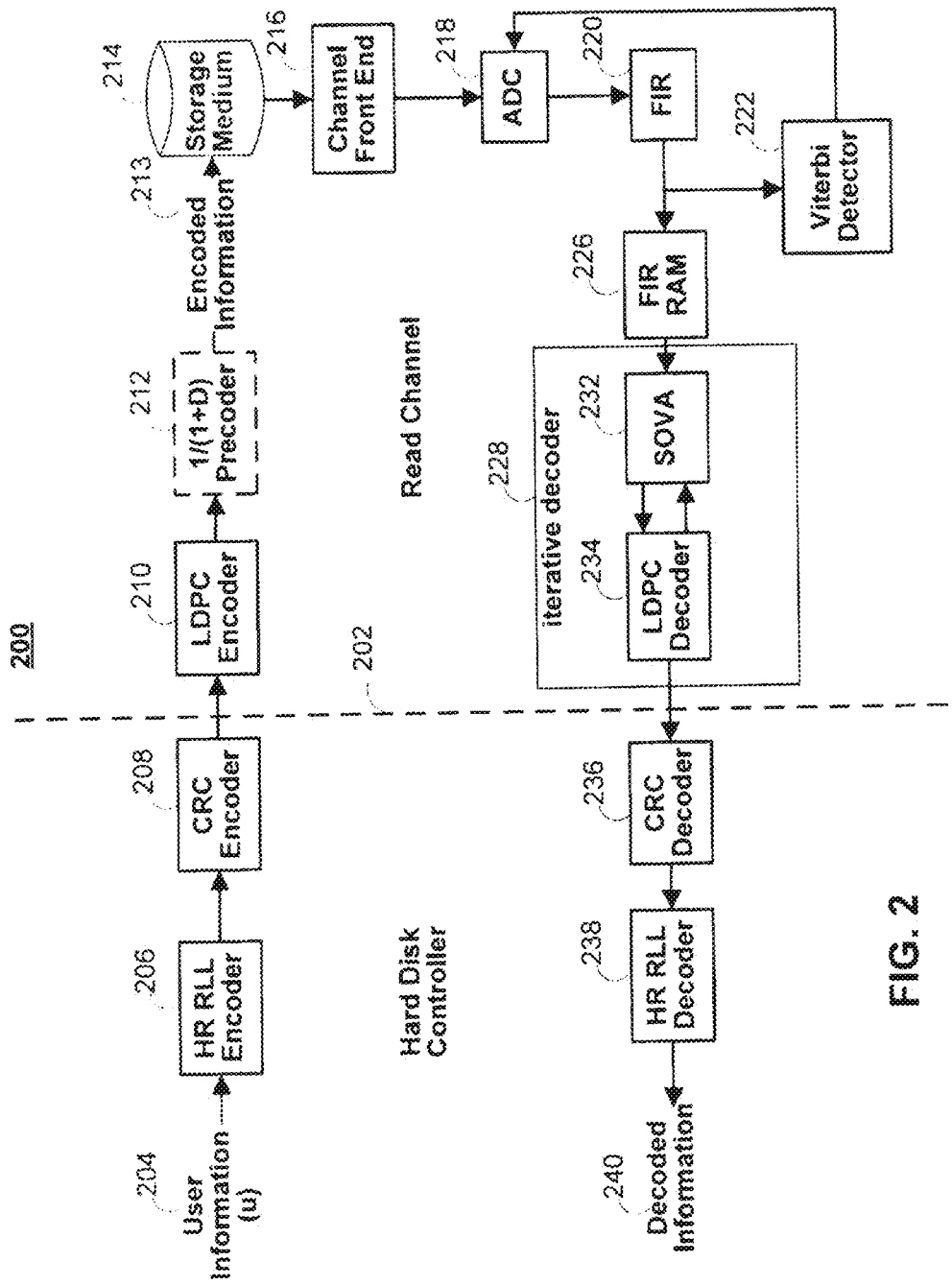

FIG. 2 shows a simplified and illustrative block diagram of digital communications or storage system 200 that can employ the disclosed technology. For example, system 200 may be a more in-depth description of system 100. Similar to system 100, system 200 can have an artificial divider 202 which separates system 200 into a hard disk controller and a RDC.

User information 204, often referred to as the message information or a message vector, may foe grouped into units of k symbols, where each symbol may be binary, ternary, quaternary, or any other suitable type of data. However, for simplicity, embodiments of the present invention will be described in terms of binary bits. User information 204 may be received by High Rate Run-Length Limited (HR RLL) encoder 206 and then passed to Cyclic Redundancy Check (CRC) encoder 208. For example, HR RLL encoder 206 and CRC encoder 208 may correspond to outer encoder(s) 110 of FIG. 1. Then, the information may be passed to LDPC encoder 210 and, optionally, to precoder 212. For example, LDPC encoder 210 and precoder 212 (if present) may correspond to inner encoder(s) 112 of FIG. 1. Together, HR RLL encoder 206, CRC encoder 208, LDPC encoder 210, and precoder 212 may act as a transmitter that prepares user information 204 to be reliably stored or transmitted in the subsequent components of system 200 and that produces encoded information 213.

HR RLL encoder 206 may ensure that user information 204 meets certain RLL constraints by imposing run-length and/or other constraints necessary to assure reliable data transmission into the data sequence of user information 204. For example, HR RLL encoder 206 may impose run-length constraints by forbidding long sequences of zeros, long sequences of ones, and/or long sequences of "0101 . . . . " in the data sequence. As another example, HR RLL encoder 206 may check for patterns that result in undesirable running digital sum properties by partitioning the data sequence into non-overlapping blocks of 24 bits, and then ensuring that there are, for example, between 6 and 18 ones in this block. Through these methods, HR RLL encoder 206 may check that the information received by CRC encoder 208 contains desirable RLL constraints. Among other things, the RLL constraints help ensure that transmitted data sequence 204 does not contain any patterns that can degrade the robustness of timing recovery and/or detection.

The resulting information may then be passed from HR RLL encoder 206 to the systematic encoder; CRC encoder 208. CRC encoder 208 may perform data integrity checks on the received information in order to detect accidental alteration of the data during the transmission or storage process. For example, CRC encoder 288 may be used for detecting errors caused by noise or miscorrections in system 200.

The resulting information may then be passed from CRC encoder 208 to LDPC encoder 210. LDPC encoder 210 is a systematic encoder. Although, not depicted in FIG. 2, many systems, such as system 200, may also contain a Reed-Solomon (RS) or BCH encoder immediately following CRC encoder 208. LDPC encoder 210 may encode the information received from CRC encoder 208 using any suitable LDPC code. For example, a quasi-cyclic LDPC code may be used. An LDPC encoder system is described in more detail in FIG. 3 and in the descriptions to follow.

LDPC ENDEC systems and techniques are described in more detail in U.S. patent application Ser. No. 11/893,936, filed Aug. 17, 2007 and U.S. patent application Ser. No. 12/277,118, filed Nov. 24, 2008, which are hereby incorporated by reference herein in their entireties.

Figure 3:
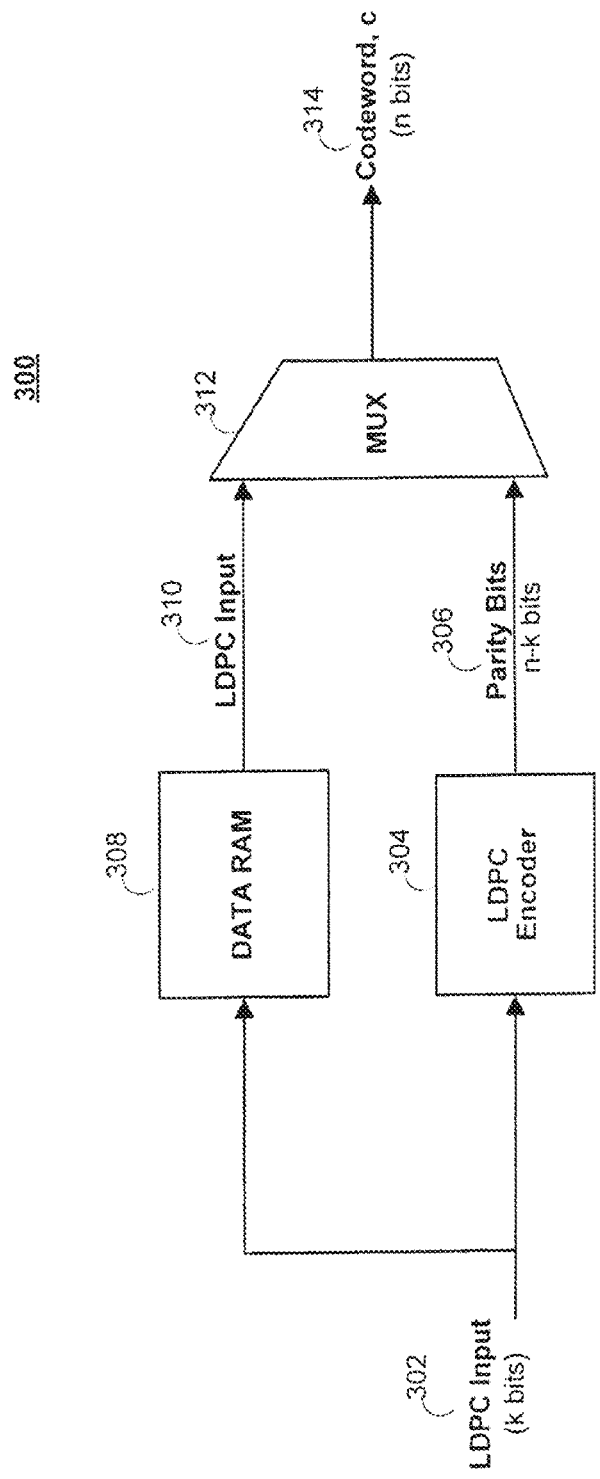
FIG. 3 is a block diagram of an illustrative Low Density Party Check (LDPC) decoder.

Generally, system 300 of FIG. 3 may take in LDPC input 302 of length k-bits, and then output codeword 314 of length n-bits by inserting n-k redundancy, or parity, bits. For example, LDPC encoder 304 may receive and use LDPC input 302 to calculate the proper n-k parity bits, illustrated by parity bits 306. Parity bits 306 may then Be added to LDPC input 302, thus resulting in codeword 314. Since the calculation of parity bits 306 requires a certain amount of calculation time, without the availability of a storage medium (e.g., RAM), parity bits 306 will typically be added to the end of the original data sequence (e.g., added to the end of LDPC input 302). However, as mentioned above, system 200 of FIG. 2 may contain HR RLL encoder 206 prior to LDPC encoder 210, which imposes RLL constraints on the data sequence received by LDPC encoder 210. Thus, although LDPC input 302 may contain RLL constraints that were imposed by an HR RLL encoder, if parity bits 306 are added to the end of LDPC input 302, the resulting codeword 314 as a whole may no longer contain these desirable RLL constraints. More specifically, since parity bits 306 have not passed through an HR RLL encoder, the end of codeword 314 (where parity bits 306 are located) may not have any RLL constraints. Thus, in some embodiments, system 300 may use data RAM 308 and multiplexer 312 to perform parity interleaving in order to maintain the RLL constraints of codeword 314.

For example, LDPC input 302 may simultaneously be stored in data MM 308 and sent to LDPC encoder 304 for processing. LDPC encoder 304 may then generate parity bits 306 from LDPC input 302. Multiplexer 312 may interleave parity bits 306 with the LDPC input bits 310 that have been read, from data RAM 308 in a manner which preserves the RLL constraints. In this manner, multiplexer 312 can control how many parity bits per input bit are inserted. For example, multiplexer 312 may pass 24 bits of LDPC input 310, then insert parity bits 306 (e.g., 2, 4, or 6 bits), then pass 24 more bits of LDPC input 310, etc.

Looking back at FIG. 2, after the data has passed through LDPC encoder 210 (e.g., after the data has passed through system 300), the data may then optionally be processed by precoder 212. Precoder 212 may be used to improve the performance of the iterative code. It should be noted that even though this application primarily focuses on a 1/(1+D) precoder, any suitable precoder can be used, e.g., 1/(1+D^2). Precoder 212 will be discussed in greater detail in FIGS. 10A-C and in the descriptions to follow.

Storage medium 214 may receive and store encoded information 213 that has been produced by encoding user information 204 through HR RLL encoder 206, CRC encoder 208, LDPC encoder 210 and precoder 212 (if present). For example, storage medium 214 may be an optical (e.g., a CD-ROM), magnetic (e.g., a hard disk), or electrical (e.g., FLASH memory or RAM) storage medium that stores encoded information 213. Alternatively, as mentioned previously, rather than representing a storage system, system 200 may also represent a communications system. In this scenario, storage medium 214 may be, for example, a wired or wireless medium through which encoded information 213 travels.

Channel front end 216 and analog-to-digital converter (ADC) 218 may generally contain components responsible for processing the signal after it has been received from storage medium 214. For example, channel front end 216 and ADC 218 may filter and digitize the received analog signal. The output from channel front end 216 may be a filtered, continuous waveform while the output from ADC 218 may be a digitized signal.

The resulting digital signal may then be equalized with finite impulse response (FIR) filter 220 to produce FIR samples. FIR filter 220 may be any suitable filter that processes the received signal to produce a signal, for example, whose impulse response settles to zero in a finite number of sample intervals.

Viterbi detector 222 may receive FIR samples and produce hard decisions based on the FIR samples for each codeword. The resulting Viterbi decisions may then be used to produce control signals for driving the various components in the RDC in order to optimize operation of the RDC. For example, the Viterbi decisions produced by Viterbi detector 222 may be used to adapt a variable gain amplifier (VGA) (not shown), synchronize sampling instances of ADC 218 to the signal frequency and phase, adapt the taps of FIR filter 220, etc. Although the output of iterative decoder 228 may alternatively be used to drive the components of the RDC, the iterations required by iterative decoder 228 may take a relatively long amount of time to complete. Thus, the RDC may experience a potentially significant lag time before the output of iterative decoder 228 is available to drive the channel. Since Viterbi detector 222 may receive the FIR samples and process the information with a relatively short latency, Viterbi detector 222 can act as a "preliminary" Viterbi decoder that quickly provides control signals for the RDC. In this manner, Viterbi detector 222 may process the FIR samples quickly to help ensure that the channel converge correctly, while iterative decoder 228 may take a longer amount of time and sufficiently checks for errors while decoding the data.

FIR RAM 226 receives FIR samples and Viterbi decisions from FIR filter 220. FIR RAM 226 allows iterative decoder 228 to be decoupled from the FIR samples produced by FIR filter 220. Iterative decoder 228 can contain a channel decoder, SOVA 232, and a code decoder, LDFC decoder 234. The decoupling of iterative decoder 228 from FIR filter 220 may significantly simplify system 200. For example, the decoupling may result in hardware complexity reduction for system 200 and may improve the latency and timing of iterative decoder 228. Iterative decoder 228 and the benefits that may be provided by FIR RAM 226 will be discussed in greater detail in the descriptions and figures to follow.

CRC decoder 236 and HR RLL decoder 238 may decode the received information using the same codes, respectively, as those used by CRC encoder 208 and HR RLL encoder 206 to produce decoded information 240. For example, HR RLL decoder 238 and CRC decoder 236 may correspond to outer decoder(s) 122 of FIG. 1. CRC decoder 236 may be used as an independent check for identifying any errors or miscorrections that may have come out of the RDC. For example, CRC decoder 236 can be a binary CRC or a Reed-Solomon based CRC (e.g., using a two error correction Reed-Solomon code over the $GF(2^{12})$ finite field).

Figure 4:
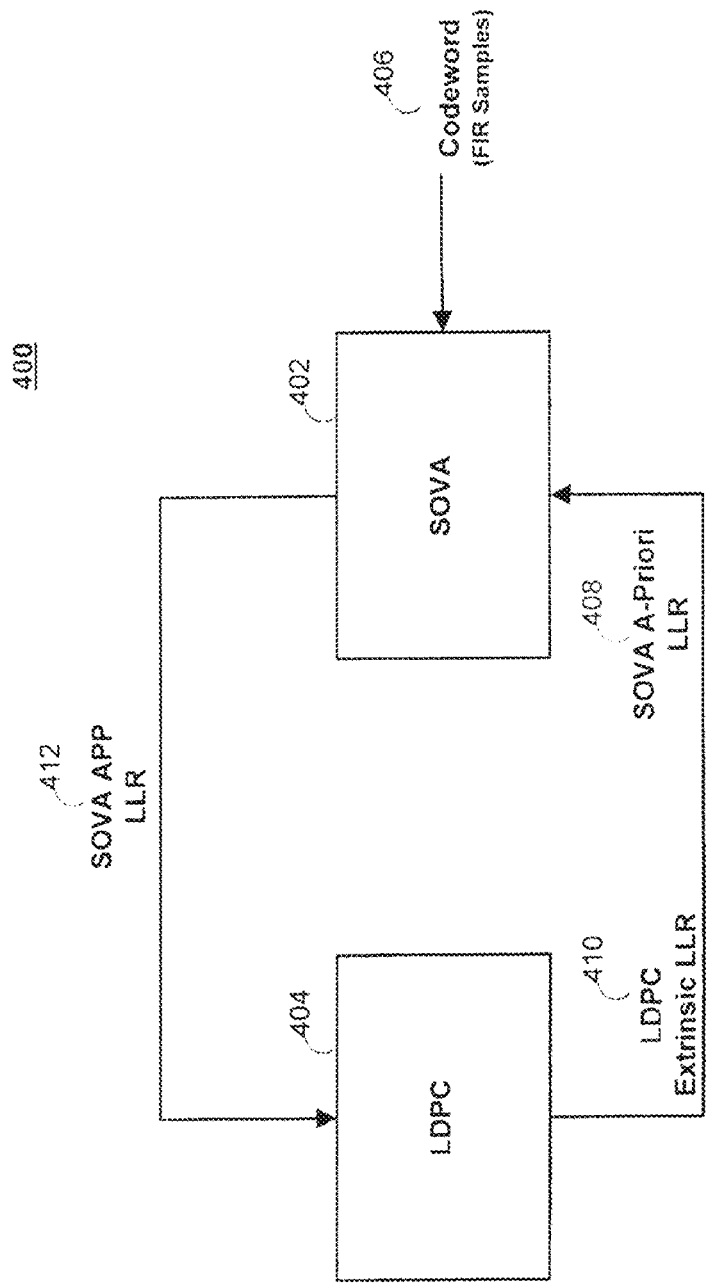
FIG. 4 is a block diagram of an illustrative iterative decoder.

FIG. 4 shows an illustrative iterative decoder system 400. For example, iterative decoder 400 may correspond to iterative decoder 228 of FIG. 2. Similarly, LDPC decoder 234 and SOVA 232 of FIG. 2 may correspond to LDPC 404 and SOVA 402 of FIG. 4. Generally, iterative decoder 400 may iterate processing the codeword between the channel decoder, SOVA 402, and the code decoder, LDPC 404. A single global iteration may occur when the codeword has been completely processed by SOVA 402 and then passed to and completely processed by LDPC 404. Local iterations refer to the LDPC decoder iterations while each global iteration includes a SOVA decoder iteration and a predetermined number (e.g., 4) of LDPC decoder iterations (i.e., local iterations). As additional global iterations are performed, the data reliability of the processed information may be significantly improved. In some embodiments, a system such as system 200 of FIG. 2 may additionally have a final decoder utilizing, for example, a Reed-Solomon code. However, in some embodiments a sufficiently reliable design may be realised without a final Reed-Solomon decoder.

In iterative decoder 400, the codeword processed by SOVA 402 may be passed to LDPC 404 for decoding, and the codeword processed by LDPC 404 may be passed back to SOVA 402 for decoding, etc. The information that is passed between SOVA 402 and LDPC 404 may be in the form of a log-likelihood-ratio (LLR) that represents a bit reliability metric (e.g., represents the probability that the received bit is a one or a zero). The LLR of a particular bit, $b_i$, may be expressed as:

$$LLR(b_i) = \log\left(\frac{P(b_i = 0)}{P(b_i = 1)}\right) \quad (1)$$

where LLR>0 implies that $b_i$=0 is more likely, and a LLR<0 implies that $b_i$=1 is more likely.

In some embodiments, SOVA 402 may be based on a Viterbi detector that may be similar to Viterbi detector 222 of FIG. 2, but may produce soft decisions as well as hard decisions. SOVA 402 receives codeword 406 from a FIR RAM such as, for example, FIR RAM 226 of FIG. 2. SOVA 402 may then update the log-likelihood-ratios based on this channel information (e.g., based on the FIR samples of codeword 406). Since codeword 406 may be significantly large in data size, for example, between half a Kbyte to two Kbytes of data, it may be beneficial to decrease the time required for SOVA 402 to process codeword 406. Rather than increasing the processing speed of SOVA 402, which may not be possible or feasible for high speed communications channels, SOVA 402 may be replicated in order to decrease the processing time of codeword 406. For example, if SOVA 402 consists of three SOVA instances, each SOVA may simultaneously process a different third of the codeword. In this manner, an entire codeword may be processed in roughly a third of the time that may typically be required by a single instance of SOVA. Note that the number of SOVA processors may be determined by the number of global iterations that are processed by the iterative decoder. For example, the disclosed embodiment uses three SOVA processors to perform three global iterations.

In addition to codeword 406, SOVA 402 may also receive SOVA a-priori LLR 408 as an input from the LDPC decoder. As is generally understood in the art, a-priori LLRs typically represent the reliability information of the transmitted bits that is obtained from the source(s) and that is independent of the channel decoder (e.g., LDPC decoder). For example, during the first global iteration where reliability information is not yet available, the SOVA a-priori LLRs may be set equal to zero for all bits. As can be seen from FIG. 4, the SOVA a-priori LLR 408 may also correspond to the LDPC extrinsic LLR 410 that is received from LDPC 404. From the SOVA a-priori LLR 408 and received FIR samples 406, SOVA 402 may generate the SOVA a-posteriori probability (APP) LLR 412. For example, an APP LLR produced by a decoder may combine the reliability of an input LLR (e.g., a-priori or input reliability information) with an extrinsic LLR (new reliability information).

LDPC 404 may then receive SOVA APP LLR 412. As LDPC 404 typically utilises SOVA extrinsic information as its LDPC a-priori information, LDPC 404 may internally remove SOVA a-priori LLR 408 from the received SOVA APP LLR 412 in order to determine codeword 406. LDPC 404 may then use the resulting SOVA extrinsic information as the LDPC a-priori information.

LDPC 404 may decode the received information based on a message passing algorithm, e.g., a min-sum or a sum-produce based on a parity check matrix H of a corresponding LDPC code. Unlike SOVA 402, which is replicated in order to process a codeword in a shorter amount of time, the processing speed of a single instance of LDPC 404 may simply be increased by increasing parallelization (i.e., the number of operations performed in one clock cycle). Thus, a single LDPC 404 may perform several (e.g., 4) local iterations (depending on parallelisation) in roughly the same amount of time required for a single SOVA 402 to process codeword 406 one time. Typically, in a single global iteration, there will be several local LDPC iterations and a single SOVA iteration. For example, in the first global iteration, SOVA 402 may process codeword 406 one time, and then pass codeword 406 to LDPC 404. LDPC 404 may then process codeword 406 several times in a row and, after the LDPC 404 iterations are completed, may pass codeword 406 back to SOVA 402 for a second global iteration.

Figure 5:
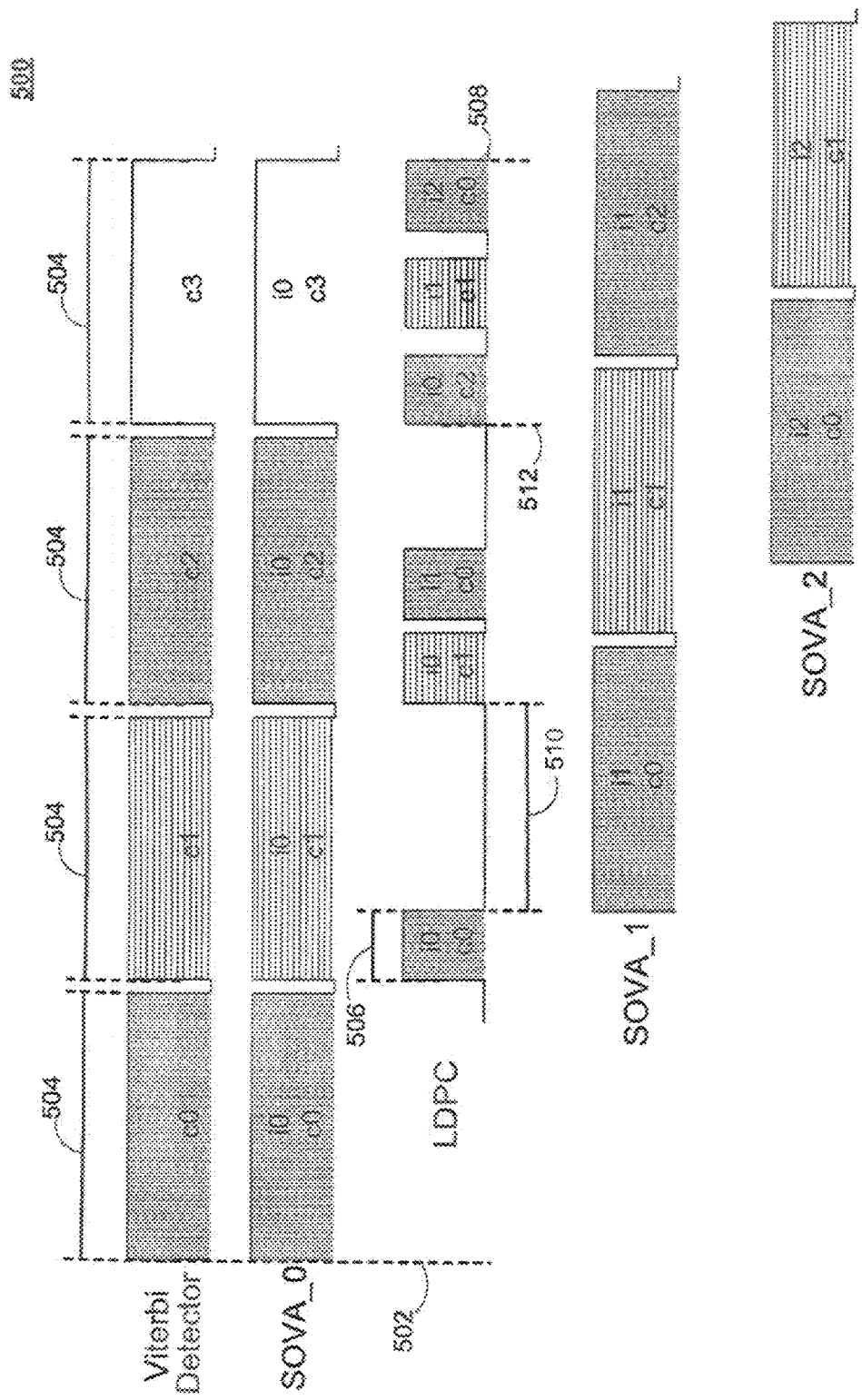
FIGS. 5 and 6 are illustrative pipeline diagrams of iterative decoder systems.
Figure 6:
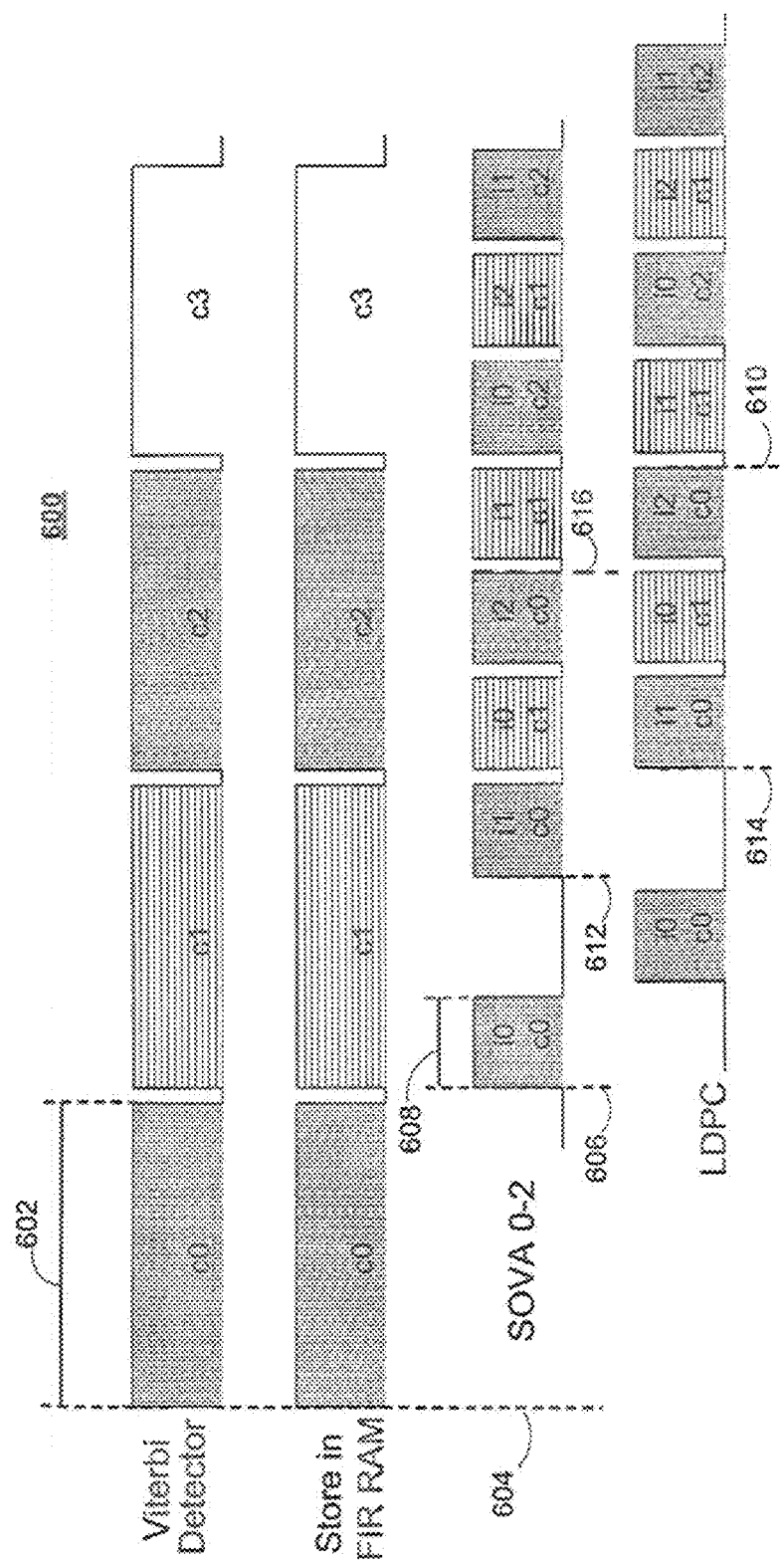

FIGS. 5 and 6 show pipeline diagrams 500 and 600 that illustrate the operation of an iterative decoder system such as system 200 of FIG. 2, in accordance with some embodiments. Pipeline diagram 500 of FIG. 5 illustrates the processing of four different codewords (c0, c1, c2, and c3) by an iterative decoder system. Each codeword in diagram 500 is processed for three global iterations; a first iteration (i0), a second iteration (i1), and a third iteration (i2). The iterative decoder system illustrated by diagram 500 also consists of three instances of SOVA (SOVA_0, SOVA_1, and SOVA_2) and one instance of LDPC. The three global iterations, four codewords, and three SOVA are chosen for illustrative purposes, and not by way of limitation. Rather, one skilled in the art would appreciate that more or less than three global iterations, four codewords, and three instances of SOVA may also be used to illustrate the same principles of pipeline diagram 500.

First codeword (c0) is received by both the Viterbi detector and SOVA_0 at point 502 of FIG. 5. Thus, Viterbi detector and SOVA_0 may both begin processing c0 at roughly the same time. In this embodiment, SOVA_0 may receive the codewords at the same time as the FIR RAM, while SOVA_1 and SOVA_2 receive buffered codewords from the FIR_RAM. As can be seen in FIG. 5, both Viterbi detector and SOVA_0 may use one codeword time length 504 to process each of codewords c0, c1, c2, and c3. Accordingly, length of time 504 may correspond to the amount of time generally required to process a single codeword (e.g., one "codeword" length of time). After SOVA_0 has finished processing c0 for the SOVA portion of the first global iteration (i0), c0 may be passed to LDPC for processing. As mentioned above, the processing speed of an LDPC may be increased in order to process a codeword in a shorter amount of time. In the example illustrated by FIG. 5, the LDPC may process a codeword three times fast as SOVA_0. Accordingly, the time required by LDPC to process a codeword, length of time 506, is roughly one third of the time required by SOVA to process the same codeword (e.g., roughly one third of length of time 504).

After LDPC has finished processing c0 and the first iteration (i0) has completed, c0 may be passed to SOVA_1 to begin the second iteration (i1). After SOVA_1 has finished processing c0 in i1, c0 may be passed back to LDPC for processing in i1. Then, c0 may be passed to SOVA_2 to begin the third iteration (i2), and once again to LDPC for processing in i2. At point 508 in FIG. 5, LDPC may finish processing the third iteration of c0, thus completing the iterative decoding process of c0. For example, in some embodiments, after point 508, c0 may be passed out of the RDC to CRC decoder 236 of FIG. 2. As can be seen from FIG. 5, in order for the illustrated iterative decoder system to process c0 through three global iterations, four codewords of latency may be required (from point 502 to point 508 on pipeline diagram 500).

As illustrated in FIG. 5, when the first codewords are received by iterative decoder system illustrated by diagram 500, LDPC may experience a length of idle time between the processing of codewords (e.g., idle time 510 between c0 and c1). By point of time 512, when the fourth codeword (c3) is being received by Viterbi detector and SOVA_0, LDPC may no longer experience idle time and may be continuously decoding codewords.

The iterative decoder system illustrated by diagram 500 uses a FIR RAM buffer that is large enough to store FIR samples for four iterative codewords. When FIR samples are provided to SOVA_0, they are also stored in the buffer. These stored FIR samples may be overwritten only when Viterbi detector is processing the fourth codeword, because during previous codeword processing times the FIR samples corresponding to the first codeword are used other instances of SOVA.

FIG. 6 shows another pipeline diagram 600 for an iterative decoder system such as system 200 of FIG. 2. As mentioned above, the decoupling of an iterative decoder from an FIR through the use of a FIR RAM may greatly simplify and benefit a system. Pipeline diagram 600 illustrates the operation such a system. Similar to diagram 500 of FIG. 5, diagram 600 illustrates a system that may process four codewords (e.g., c0, c1, c2, and c3) through three global iterations (e.g., i1, i2, and i3) and that may have three instance of SOVA (e.g., SOVA 0-2) and one LDPC. As can be seen in FIG. 6, Viterbi detector may use length of time 602 to process each of codewords c0, c1, c2, and c3. Accordingly, length of time 604 may correspond to length of time 504 from FIG. 5, and generally relates to the amount of time typically required to process a single codeword (e.g., one "codeword" length of time).

Viterbi detector may receive (e.g., from FIR filter 220 of FIG. 2) and begin processing the first codeword (c0) at point of time 604 in FIG. 6. Additionally, FIR RAM (e.g., FIR RAM 226 of FIG. 2) may also being storing c0 at point of time 604. However, unlike the system illustrated in diagram 500 of FIG. 5, the SOVA in system illustrated in diagram 600 begins processing c0 at point of time 606 after the entire codeword has been stored in FIR RAM and not at the same time the Viterbi detector begins processing c0.

Additionally, the three instance of SOVA (e.g., SOVA 0-2) may simultaneously process different sections of c0 at the same time. Thus, SOVA 0-2 may complete processing the SOVA portion of the first iteration (i0) in length of time 608, where length oil time 608 is roughly one third of length of time 602 (e.g., one third of a codeword length of time).

After SOVA 0-2 have completed processing c0, c0 may be passed to LDPC to process the LDPC portion of the first global iteration (i0). After LDPC has finished processing c0 and the first iteration (i0) has completed, c0 may be passed to SOVA 0-2 to begin the second iteration (i1). After SOVA 0-2 have finished processing c0 in i1, c0 may be passed back to LDPC for processing in i1. Then, c0 may be passed to SOVA 0-2 to begin the third iteration (i2), and once again to LDPC for processing in i2. At point of time 610. LDPC may finish processing the third iteration of c0, thus completing the iterative decoding process of c0.

As can be seen from FIG. 6, in order to process c0 through three global iterations, iterative decoder system illustrated by diagram 600 may require three codewords of time (e.g., from point 604 to point 610). Therefore, iterative decoder system illustrated by diagram 500 may require one less codeword of time than system 500 in order to process a codeword through three global iterations. Furthermore, the FIR RAM for the iterative decoder system illustrated by diagram 600 only needs to store three codewords, as opposed to four codewords described above with respect to iterative decoder system illustrated by diagram 500.

When the first codewords are received by iterative decoder system illustrated by diagram 600, SOVA 0-2 and LDPC may experience idle time when they are not processing a codeword. However, as seen in FIG. 6, by point of time 612, SOVA 0-2 is continuously processing codewords and may no longer be idle. Similarly, by point of time 614, LDPC may be continuously processing codewords. Thus, by the time the Viterbi detector begins processing the third codeword (c2), there may potentially be no idle components in the iterative decoder.

Another advantage of iterative decoder system illustrated by diagram 600 is that the codeword processing may be completed with less memory to exchange the soft information that is used within an iterative decoder by the SOVA and LDPC. For example, c0 may only need to be held in memory up until point of time 616 in FIG. 6, when SOVA 0-2 finish processing the third iteration of c0. Thus, the soft information for c0 may be held for at most two codewords of time (from point of time 606 to point of time 616). In contrast, iterative decoder system illustrated by diagram 500 may be required to hold the soft information for c0 for three codewords of time. Thus, iterative decoder system illustrated by diagram 600, may advantageously require less memory than a system which does not buffer the FIR samples.

Figure 7:
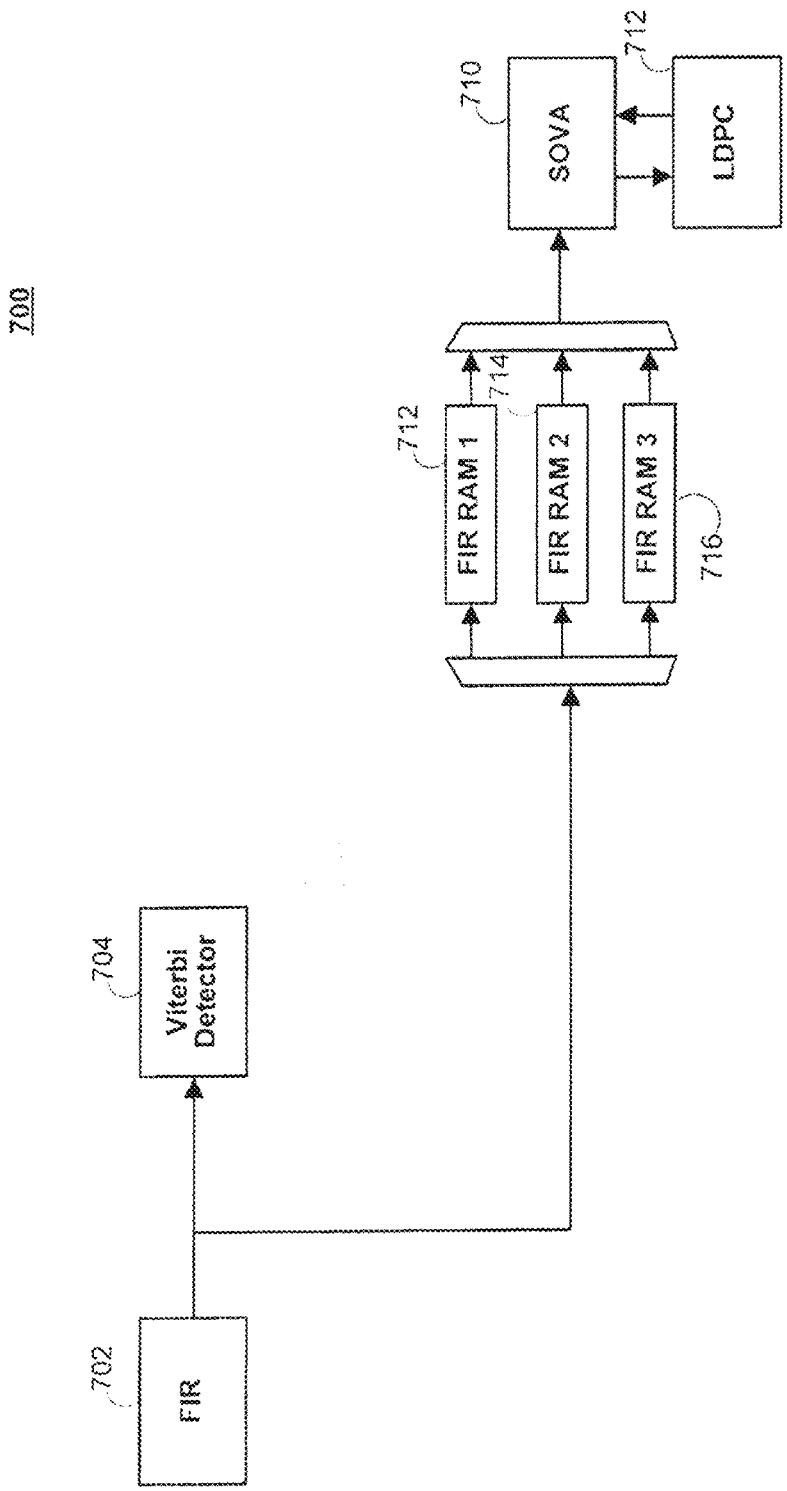
FIG. 7 is a simplified block diagram of a Soft Output Viterbi Algorithm (SOVA) decoder system utilizing FIR RAM.

FIG. 7 shows system 700 which may illustrate the memory requirements for an iterative, decoder system, such as iterative decoder system illustrated by diagram 600 of FIG. 6, that utilises a FIR RAM to buffer the FIR samples. Analogous to system 200 of FIG. 2, system 700 may contain an FIR filter 702, Viterbi detector 704, SOVA 710, and LDPC 712. As can be seen from FIG. 6, the iterative decoder of system 600 may take at most two codewords of time to process a codeword for three global iterations (e.g., from point of time 606 to point of time 610 on FIG. 6). Accordingly, system 600 may need to buffer at most three codewords of FIR samples at a time. For example, at point of time 616 of FIG. 6, system 600 may need to buffer c0, c1, and c2. However, after point of time 610 of FIG. 6, system 600 may have finished the iterative decoding of c0 and thus no longer needs to buffer c0. Therefore, after point of time 610, system 600 may instead buffer c1, c2, and c3. Accordingly, system 700 may contain three instance of FIR RAM (e.g., FIR RAM 712, FIR RAM 714, and FIR RAM 716) in order to store three codewords at a time.

As mentioned above, in an iterative decoder the SOVA and the LDPC may pass information corresponding to codewords back and forth to each other. For example, FIG. 4 illustrates that SOVA 402 may process a codeword and then pass SOVA APP LLR 412 to LDPC 404. LDPC 404 may then process the same codeword and pass LDPC Extrinsic 410 to SOVA 402, which SOVA 402 may then utilize at its SOVA a-priori LLR 408. On the SOVA side, a SOVA may typically perform a single local iteration and then pass the resulting APP LLR to the LDPC. The LDPC, however, may perform several local iterations before providing the SOVA with the appropriate a-priori LLR.

Figure 8:
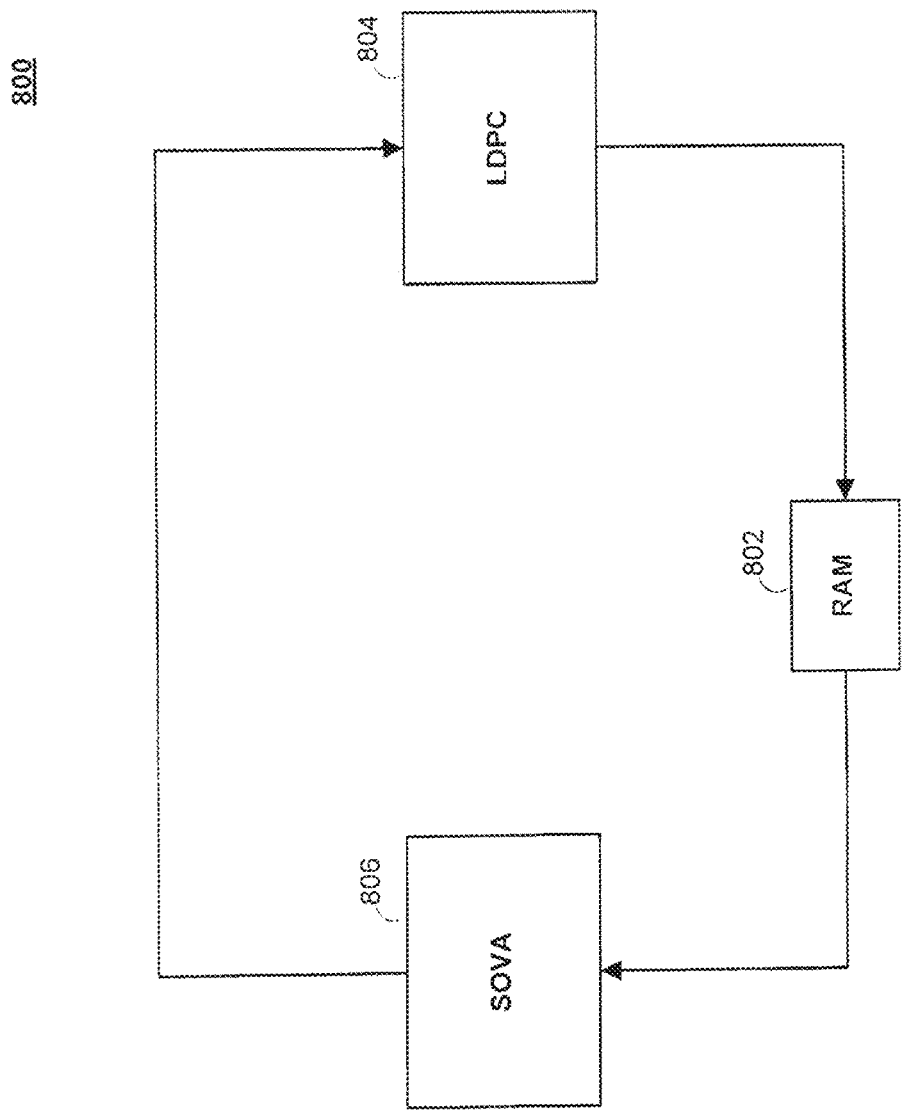
FIG. 8 is a block diagram of an illustrative iterative decoder.

A SOVA is a sequential decoder that may receive a continuous input and then provide a continuous output. Accordingly, in order to effectively provide the SOVA with the extrinsic LLRs from the LDPC, in some embodiments a buffer may be used in-between the LDPC end SOVA. For example, FIG. 8 illustrates iterative decoder 800 with RAM 802 that may buffer the information passed from LDPC 804 to SOVA 806. The output from LDPC 804 may be stored in RAM 802 until SOVA 806 is ready to take it out. SOVA 806 may then read the resulting LDPC extrinsic LLR from RAM 802 for use in its own local iteration.

However, in some embodiments it may be beneficial to avoid using a dedicated memory between the LDPC and SOVA and to instead continuously serialize the information needed by the SOVA from the internal LDPC decoder memory. For example, the LDPC may generate information referred to as R-messages during each local iteration, which are stored in an internal memory within the LDPC. SOVA may utilise these R-messages in order to calculate the required information. For example, the SOVA may sum the R-messages according to the equation:

$$LLR_{a-priori}(b_i) = \sum_{X=c_i}^{X=b_i} R-message_X \quad (2)$$

where $b_i$ is a particular bit of the codeword. With the summation of the R-messages, the SOVA may be able to determine the appropriate a-priori LLR information. Accordingly, it may be possible to serialise the required SOVA information "on the fly" by continuously reading R-messages, summing the R-messages, and then sending this information to the SOVA.

Figure 9:
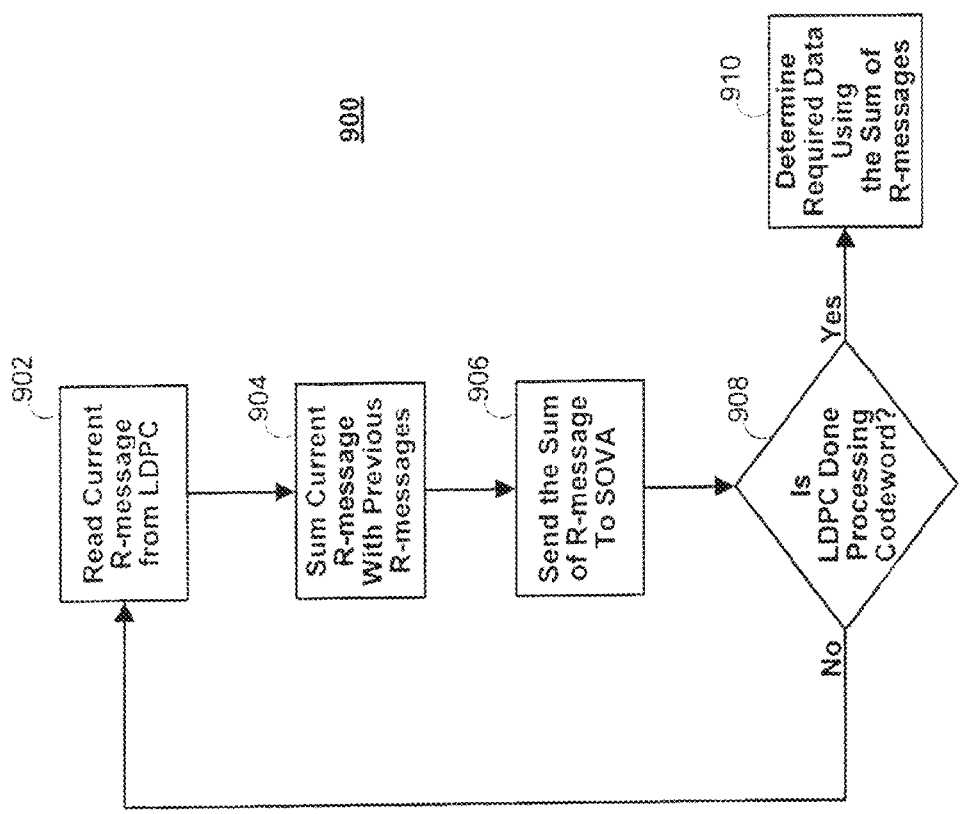
FIG. 9 is a flowchart of an illustrative process for determining SOVA required information from LDPC generated R-messages.

FIG. 9 shows process 900 which may obtain SOVA required information by continuously serializing R-messages from an LDPC. In step 902, the current R-message may be read from the LDPC. For example, the R-message may be read from an internal, memory within the LDPC.

In step 904, the current R-message may be summed with all of the previous R-messages for that iteration of LDPC decoder. Each bit in the R-message may be connected to multiple parity checks as well as to the channel decoder. Consequently, each bit gets reliability information from each of these sources. The messages from check equations (also known as check nodes) to the bit node is called an R-message. Therefore summing the R-messages over all check nodes connected to a given bit, gets total reliability information from LDPC code to a bit (or LDPC extrinsic information).

In step 906, the sum of the R-messages is provided to the SOVA. In step 308, process 900 may then determine whether or not the LDPC is done processing the current codeword. If the LDPC is not done processing the codeword, then the LDPC may still have additional iterations to perform for processing the codeword and thus will generate additional R-messages. Accordingly, in response to the LDPC not being done processing the codeword, process 900 may return to steps 902, 904, and 908, and once again may read the current R-message, sum the R-messages, and then provide the sum to the SOVA.

If the LDPC has finished processing the codeword, then the current sum is calculated from all R-messages that will foe generated for the current codeword. Accordingly, process 900 may then progress to step 910 and determine the SOVA required information using the sum of the R-messages. For example, the sum of the R-messages may be used to determine the SOVA a-priori LLR. The SOVA may then use the determined information to drive its own local iteration.

Figure 10A:
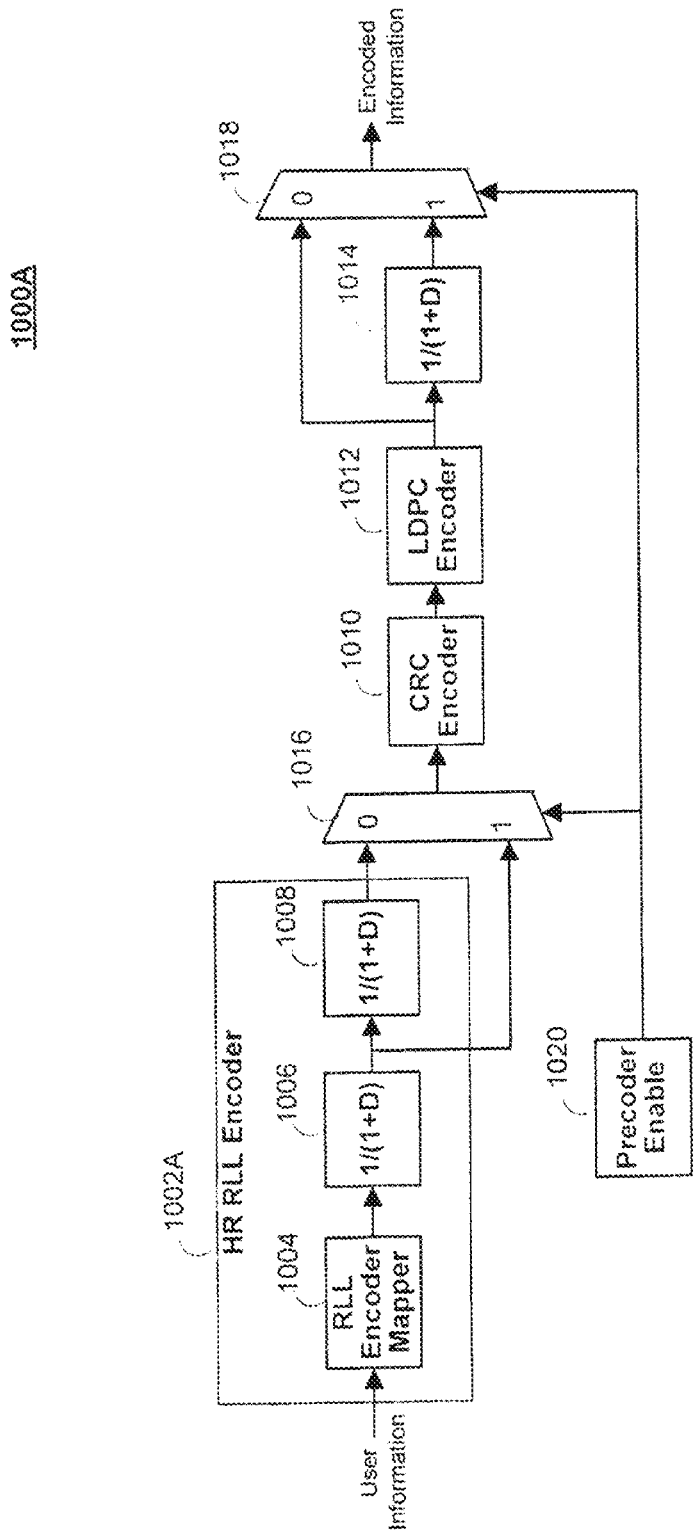
FIGS. 10A-C are block diagrams of illustrative precoder systems.

FIG. 10A shows system 1000A that illustrates in more depth a precoder system, that may be utilized with an iterative decoder. For example, 1/(1+D) precoder 1014 may correspond to precoder 212 of FIG. 2. Similarly, HR RLL encoder 1002A, CRC encoder 1010, and LDPC encoder 1012 may correspond, respectively, to HR RLL encoder 206, CRC encoder 200, and LDPC encoder 210 of FIG. 2.

As mentioned above, in some embodiments it may be beneficial to include a precoder in an iterative decoder system. For example, using a precoder in this system may result in a HR RLL encoder design that is simpler in design. Alternatively or additionally, a precoder may provide extra gain, and thus extra performance, for an iterative decoder that exists later in the channel. However, depending on the exact circumstances, a precoder may potentially improve or may potentially hurt the channel performance. Accordingly, in some embodiments it may be beneficial to include a precoder enable 1020 that controls whether precoder 1014 is functional. For example, in illustrative FIG. 10A, if precoder enable 1020 is set to "1", precoder 1014 will effectively be turned ON. However, if precoder enable 1020 is set to "0", precoder 1014 will effectively be turned OFF.

HR RLL encoder 1002A may contain an RLL encoder mapper 1004 and its own precoder of the type $1/(1+D^2)$. As mentioned above, an HR RLL encoder may add RLL constraints, which are systematic constraints, to the received user information. A systematic constraint or a systematic code may be beneficial instruments for adding redundancy information into the encoded output and to aid in detecting errors in the information. More particularly, a systematic code results in the input data becoming embedded in the encoded output information. However, after the RLL constraint has been imposed on the user information, the resulting information, cannot be encoded with a non-systematic code, or the RLL constraints may be destroyed. CRC encoder 208 and LDPC encoder 210 are both systematic encoders, so the information passed through them will still have the RLL constraints. However, using the 1/(1+D) precoder 1014 in addition to the 1/(1+D²) precoder of HR RLL encoder 1002A results in a non-systematic code being introduced to system 1000A, thus resulting in encoded information that may no longer have the desirable RLL constraints.

In order to preserve the RLL constraints and still allow precoder 1014 to operate in addition to the precoder of HR RLL encoder 1002A, the 1/(1+D²) precoder may be split into two 1/(1+D) precoders. Generally, two 1/(1+D) precoders that are placed in serial may perform the same function as a single 1/(1+D). For example, in FIG. 10A the 1/(1+D²) precoder has been replaced with two 1/(1+D) precoders, precoder 1006 and precoder 1008. Then, one of the 1/(1+D) precoders may be pulled outside of HR RLL encoder to function as precoder 1014.

For example, if precoder enable 1020 is turned ON (e.g., set equal to "1"), mux 1016 may only allow the output from precoder 1006 to be passed from the HR RLL encoder 1002A. The output from precoder 1008, on the other hand, will not be passed through mux 1016, and precoder 1008 will effectively be turned OFF. Additionally, when precoder enable 1020 is turned ON, mux 1018 may allow the output from precoder 1014 to proceed through system 1000A as the resulting encoded information. Thus, when precoder enable 1020 is turned ON, precoder 1014 may function as the precoder for the iterative decoder system (e.g., may function as precoder 212 of FIG. 2), and precoder 1006 and precoder 1014 may together function as the 1/(1+D²) precoder that is used with HR RLL encoder 1002A. In this embodiment, the RLL constraints imposed by HR RLL encoder 1002A may not hold until after precoder 1014, when both of the two 1/(1+D) precoders have processed the information. If precoder enable 1020 is ON, then a post coding operation on the decoder side should also be incorporated into the channel decoder. For example, the post coding operation may be incorporated into SOVA 232 of FIG. 2.

If precoder enable 1020 is turned OFF (e.g., set equal to "0"), mux 1010 may allow the output from both precoder 1006 and precoder 1008 to be passed from HR RLL encoder 1002A. Accordingly, RLL constraints may be imposed on the data after passing through precoder 1008. Furthermore, when precoder enable 1020 is turned OFF, mux 1018 will not allow the output from precoder 1014 to proceed, and precoder 1014 is effectively turned OFF.

Figure 10B:
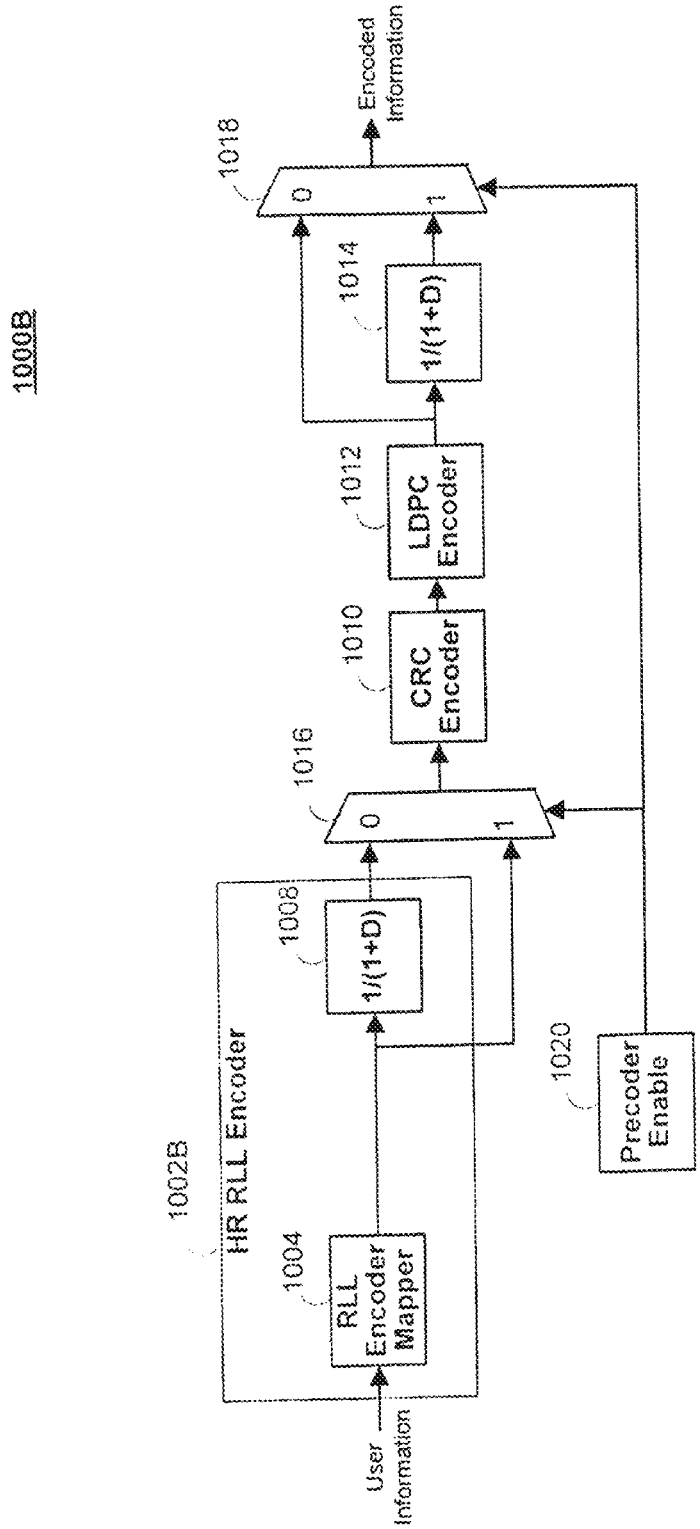

FIG. 10B shows system 1000B that illustrates another precoder system that may be utilized with an iterative decoder. System 1000B is the same as system 1000A of FIG. 10A, except that HR RLL encoder 1002B has a 1/(1+D) precoder instead of a 1/(1+D^2) precoder. Precoder enable 1020 may then be used to effectively turn on and off precoder 1008.

Figure 10C:
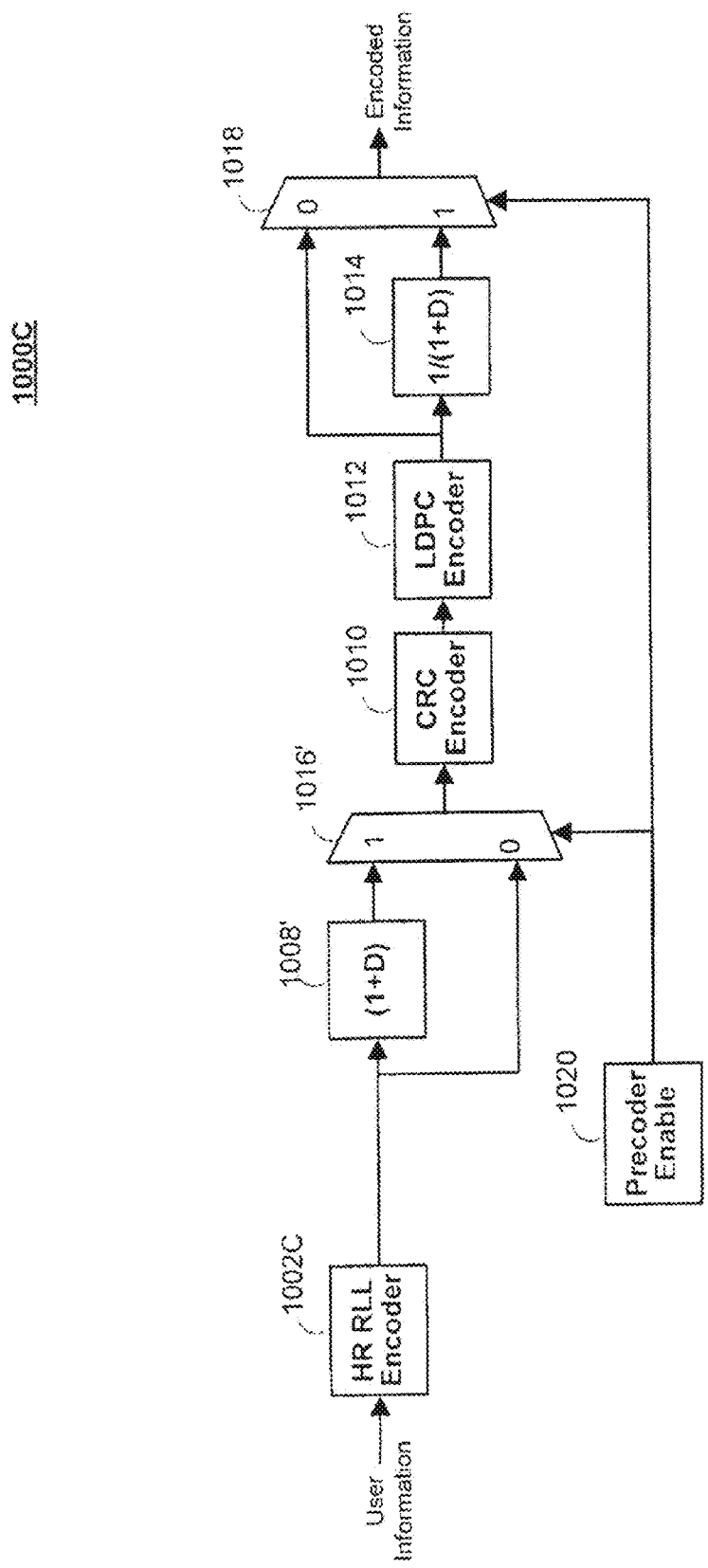

FIG. 10C shows system 1000C that illustrates another precoder system that may be utilized with an iterative decoder. System 1000C is the same as system 1000B of FIG. 10B, except that HR RLL encoder 1002C either does not have a a 1/(1+D) precoder or there is no access to the signal before the precoder to bypass the precoder. In this embodiment, a (1+D) post-coder may be inserted after HR RLL encoder 1000C. Precoder enable 1020 may then be used to effectively turn on and off postcoder 1008'. Note that because the combined effect of (1+D) postcoder 1008' and the 1/(1+D) precoder after the LDPC encoder is a unity operator that will preserve the constraints enforced by the HR RLL encoder for RLL codes of interest.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method for performing iterative decoding, the method comprising:
   receiving, at a FIR RAM, a LDPC codeword formed from a plurality of FIR samples;
   processing, at each of a plurality of channel decoders, a portion of the LDPC codeword to produce a one of a plurality of portions of a processed LDPC codeword;
   receiving, at a LDPC decoder, the plurality of portions of the processed LDPC codeword which forms the processed LDPC codeword; and
   decoding, at the LDPC decoder, the processed LDPC codeword.

2. The method of claim 1, wherein each of the plurality of channel decoders process their respective portion of the LDPC codeword concurrently in a same time period.

3. The method of claim 2, wherein the same time period is equal to a length of time based on a number of channel decoders processing the LDPC codeword.

4. The method of claim 1, wherein the FIR RAM has a depth based on a decoding rate of the plurality of channel decoders and a decoding rate of the LDPC decoder, wherein the depth represents a number of LDPC codewords which are stored in the FIR RAM.

5. The method of claim 4, wherein the FIR RAM comprises a plurality of memory buffers, each storing a separate LDPC codeword.

6. The method of claim 1, wherein a number of outer iterations occur sequentially between the plurality of channel decoders and the LDPC decoder, and wherein a number of channel decoders is equal to the number of outer iterations.

7. The method of claim 1, further comprising:
   receiving, from the FIR RAM, the plurality of portions of the LDPC codeword at the plurality of channel decoders during a first outer iteration;
   storing, at a decoder RAM, an LDPC processed LDPC codeword from the LDPC decoder; and
   receiving, from the decoder RAM, a plurality of portions of the LDPC processed LDPC codeword at the plurality of channel decoders during subsequent outer iterations after the first outer iteration.

8. The method of claim 7, wherein the LDPC processed LDPC codeword comprises extrinsic least likelihood ratio (LLR) information generated by the LDPC decoder.

9. The method of claim 1, where the LDPC codeword received at each of the plurality of channel decoders comprises a-priori least likelihood ratio (LLR) information.

10. The method of claim 1, wherein the a-priori LLR information is equal to zero.

11. A system for performing iterative decoding, the system comprising:
   a FIR RAM, wherein the FIR RAM is configured to receive a LDPC codeword formed from a plurality of FIR samples;
   a plurality of channel decoders, wherein each of a plurality of channel decoders is configured to:
      receive one of a plurality of portions of the LDPC codeword, wherein each channel decoder receives a different portion of the LDPC codeword; and
      process, a portion of the LDPC codeword to produce one of a plurality of portions of a processed LDPC codeword; and
   an LDPC deocoder, wherein the LDPC decoder is configure to:

receive the plurality of portions of the processed LDPC codeword which forms the processed LDPC codeword; and decode the processed LDPC codeword.

12. The system of claim 11, wherein each of the plurality of channel decoders process their respective portion of the LDPC codeword concurrently in a same time period.

13. The system of claim 12, wherein the same time period is equal to a length of time based on a number of channel decoders processing the LDPC codeword.

14. The system of claim 11, wherein the FIR RAM has a depth based on a decoding rate of the plurality of channel decoders and a decoding rate of the LDPC decoder, wherein the depth represents a number of LDPC codewords which are stored in the FIR RAM.

15. The system of claim 14, wherein the FIR RAM comprises a plurality of memory buffers, each storing a separate LDPC codeword.

16. The system of claim 11, wherein a number of outer iterations occur sequentially between the plurality of channel decoders and the LDPC decoder, and wherein a number of channel decoders is equal to the number of outer iterations.

17. The system of claim 11, further comprising:
a decoder RAM, wherein the decoder RAM is configured to store an LDPC processed LDPC codeword from the LDPC decoder; and wherein each of the plurality of channel decoders is further configured to:

receive, from the FIR RAM, the plurality of portions of the LDPC codeword during a first outer iteration; and receive, from the decoder RAM, a plurality of portions of the LDPC processed LDPC codeword during subsequent outer iterations after the first outer iteration.

18. The system of claim 17, wherein the LDPC processed LDPC codeword comprises extrinsic least likelihood ratio (LLR) information generated by the LDPC decoder.

19. The system of claim 11, where the LDPC codeword received at each of the plurality of channel decoders comprises a-priori least likelihood ratio (LLR) information.

20. The system of claim 11, wherein the a-priori LLR information is equal to zero.

* * * * *